(12) United States Patent
Xu et al.

(10) Patent No.: US 11,463,096 B2
(45) Date of Patent: Oct. 4, 2022

(54) ZERO-DELAY PHASE-LOCKED LOOP FREQUENCY SYNTHESIZER BASED ON MULTI-STAGE SYNCHRONIZATION

(71) Applicant: ZHEJIANG UNIVERSITY, Hangzhou (CN)

(72) Inventors: Zhiwei Xu, Hangzhou (CN); Jiangbo Chen, Hangzhou (CN); Jiabing Liu, Hangzhou (CN); Hui Nie, Hangzhou (CN); Kaijie Ding, Hangzhou (CN); Chunyi Song, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/489,809

(22) Filed: Sep. 30, 2021

(65) Prior Publication Data

US 2022/0021394 A1    Jan. 20, 2022

Related U.S. Application Data

(63) Continuation of application No. PCT/CN2020/084245, filed on Apr. 10, 2020.

(30) Foreign Application Priority Data

Aug. 30, 2019 (CN) .......................... 201910812883.9

(51) Int. Cl.
*H03L 7/18* (2006.01)
*H03L 7/089* (2006.01)
(Continued)

(52) U.S. Cl.
CPC .............. *H03L 7/18* (2013.01); *H03L 7/0891* (2013.01); *H03L 7/099* (2013.01); *H04B 1/40* (2013.01)

(58) Field of Classification Search
CPC .......... H03L 7/18; H03L 7/0891; H03L 7/099; H04B 1/40
See application file for complete search history.

(56) References Cited

U.S. PATENT DOCUMENTS

| | | | |
|---|---|---|---|
| 7,999,623 B2* | 8/2011 | Lin | ........................ H03L 7/1976 331/25 |
| 8,368,436 B1* | 2/2013 | Chu | ........................ H03L 7/183 327/147 |

(Continued)

FOREIGN PATENT DOCUMENTS

| | | |
|---|---|---|
| CN | 1540869 A | 10/2004 |
| CN | 108173545 A | 6/2018 |

(Continued)

OTHER PUBLICATIONS

International Search Report (PCT/CN2020/084245); dated Jul. 7, 2020.

(Continued)

*Primary Examiner* — Adam D Houston
(74) *Attorney, Agent, or Firm* — W&G Law Group

(57) ABSTRACT

Disclosed is a zero-delay phase-locked loop frequency synthesizer based on multi-stage synchronization, which belongs to the technical field of integrated circuits. The zero-delay phase-locked loop frequency synthesizer comprises: a phase frequency detector, a charge pump, a loop pass filter, a voltage control oscillator and a multi-stage synchronization divider, wherein the phase frequency detector, the charge pump, the loop pass filter and the voltage control oscillator are connected in sequence; an output OUT of the voltage control oscillator is connected to an input IN of the multi-stage synchronization divider; and an output OUT of the multi-stage synchronization divider is connected to an input IN of the phase frequency detector, so as to form a feedback path.

3 Claims, 6 Drawing Sheets

(51) Int. Cl.
  *H03L 7/099* (2006.01)
  *H04B 1/40* (2015.01)

(56) References Cited

U.S. PATENT DOCUMENTS

| | | | |
|---|---|---|---|
| 9,369,139 B1 | 6/2016 | Chu et al. | |
| 2009/0140817 A1* | 6/2009 | Deng | H03L 7/193 331/117 R |
| 2009/0267664 A1* | 10/2009 | Uozumi | H03L 7/193 327/158 |
| 2011/0227614 A1* | 9/2011 | Anandakumar | H03L 1/026 327/156 |
| 2014/0320182 A1* | 10/2014 | Sanderford, Jr. | H04W 36/08 327/156 |
| 2015/0073739 A1* | 3/2015 | Khan | G01R 23/02 702/78 |
| 2015/0326236 A1* | 11/2015 | Thiagarajan | H04B 1/40 375/221 |
| 2017/0048057 A1* | 2/2017 | Kim | H04W 4/80 |
| 2017/0366193 A1* | 12/2017 | Matsumura | G01S 7/03 |
| 2021/0203307 A1* | 7/2021 | Tsai | H01P 5/16 |
| 2022/0021394 A1* | 1/2022 | Xu | H03L 7/193 |

FOREIGN PATENT DOCUMENTS

| | | |
|---|---|---|
| CN | 209375613 U | 9/2019 |
| CN | 110311672 A | 10/2019 |
| CN | 110581709 A | 12/2019 |

OTHER PUBLICATIONS

"Study of Frequency Divider Based on PLL Frequency Synthesizer" (AN,Na) [Jul. 15, 2015].
"A novel pulse swallow based frequency divider circuit for a phase-locked loops" (HATI, Manas Kumar et al.) [Apr. 22, 2017].
International Search Report (PCT/CN2020/084245); dated Apr. 10, 2020.

* cited by examiner

US 11,463,096 B2

ZERO-DELAY PHASE-LOCKED LOOP FREQUENCY SYNTHESIZER BASED ON MULTI-STAGE SYNCHRONIZATION

CROSS-REFERENCE TO RELATED APPLICATIONS

The present application is a continuation of International Application No. PCT/CN2020/084245, filed on Apr. 10, 2020, which claims priority to Chinese Application No. 201910812883.9, filed on Oct. 30, 2019, the contents of both of which are incorporated herein by reference in their entireties.

TECHNICAL FIELD

The present disclosure relates to the technical field of integrated circuits, in particular to a zero-delay phase-locked loop frequency synthesizer based on multi-stage synchronization.

BACKGROUND

A phase-locked loop is a frequency control system, which is widely used in circuit design, including clock generation, clock recovery, jitter and noise reduction, frequency synthesis and the like. The operation of PLL is based on the phase difference between feedbacks of a reference clock signal and an output clock signal of a voltage control oscillator (VCO). A traditional PLL includes a phase frequency detector, a charge pump, a loop pass filter, a voltage control oscillator and a divider on a feedback loop. For an ideal circuit, the divider is triggered by the edge of the clock signal output by the voltage control oscillator, so the input and output clock signals should be edge aligned, while the feedback clock signal output by the voltage control oscillator through the divider and the reference clock signal are aligned through a loop, and finally the phases of the clock signal output by the voltage control oscillator and the reference clock signal are consistent. However, in an actual circuit, due to a large number of nonlinear delays in each module of the divider, even if the phase of the feedback clock signal is consistent with that of the reference clock signal, the accurate phase of the output clock signal of the voltage control oscillator cannot be determined.

In order to overcome this problem, zero-delay clock technology arose. The traditional zero-delay clock technology is to add an adjustable delay unit to a feedback loop, and obtain a zero-delay clock by automatic calibration of a digital circuit or artificial adjustment. But this obviously increases the complexity of the circuit greatly.

SUMMARY

The purpose of the present disclosure is to provide an output clock signal with the same phase as the reference clock signal without increasing the circuit complexity. The present disclosure provides a zero-delay phase-locked loop frequency synthesizer based on multi-stage synchronization.

In order to achieve the above purpose, the present disclosure uses a multi-stage synchronization structure with a tree-like connection, which reduces the requirement of nonlinear delay of the whole circuit to a certain extent. The present disclosure is realized by the following technical solution: a zero-delay phase-locked loop frequency synthesizer based on multi-stage synchronization, comprising a phase frequency detector, a charge pump, a loop pass filter, a voltage control oscillator and a multi-stage synchronization divider, wherein an output OP end of the phase frequency detector is connected with an input IP end of the charge pump, an output ON end of the phase frequency detector is connected with an input IN end of the charge pump, an output end of the charge pump is connected with an input end of the loop pass filter, an output end of the loop pass filter is connected with an input end of the voltage control oscillator, an output end of the voltage control oscillator is connected with an input end of the multi-stage synchronous divider, and an output end of the multi-stage synchronous divider is connected with an input IN end of the phase frequency detector to form a feedback path.

Furthermore, the multi-stage synchronization divider adopts a PS counter structure, and specifically comprises a dual-modulus divider, a P counter, an S counter, a first clock synchronization module SYN1, a second clock synchronization module SYN2 and a third clock synchronization module SYN3; the output end of the voltage control oscillator is simultaneously connected with an input end a of the dual-modulus divider, an synchronization end c of the first clock synchronization module SYN1 and an synchronization end c of the third clock synchronization module SYN3; an output end b of the dual-modulus divider is connected with an input end a of the first clock synchronization module SYN1, and an output end b of the first clock synchronization module SYN1 is simultaneously connected with an input end a of the S counter, an input end a of the P counter and an synchronization end c of the second clock synchronization module SYN2; an output end b of the S counter is connected to a mode switch end c of the dual-modulus divider, and an output end b of the P counter is connected to an input end a of the second clock synchronization module SYN2, an output end b of the second clock synchronization module SYN2 is connected to an input end a of the third clock synchronization module SYN3, and an output end b of the third clock synchronization module SYN3 is connected to an input IN end of the phase frequency detector; an output signal CLK_VCO of the voltage control oscillator is further connected to the synchronization end c of the synchronization module SYN1 and the synchronization end c of the synchronization module SYN3.

Furthermore, the output clock signal CLK_VCO of the voltage control oscillator is input to the multi-stage synchronization divider, and a clock signal CLK1 obtained by frequency division by the dual-modulus divider is input to the first clock synchronization module SYN1; the first clock synchronization module SYN1 takes CLK_VCO as a trigger clock to obtain an output signal CLK2, which is input to the P counter and the S counter; the S counter outputs a MC signal, the P counter outputs a pulse signal CLK3; the pulse signal CLK3 is input to the second clock synchronization module SYN2 to obtain an output signal CLK4; the pulse signal CLK4 is input to the third clock synchronization module SYN3 to obtain CLK_DIV; the CLK_DIV is input into the phase frequency detector (PFD), and is compared with a reference clock CLK_REF in terms of phase.

Furthermore, a delay $T_{syn1}$ of the first clock synchronization module SYN1, a delay $T_{syn2}$ of the second clock synchronization module SYN2 and a delay $T_{CLK\_VCO}$ of the voltage control oscillator satisfy:

$$T_{syn1}+T_{syn2}<T_{CLK\_VCO}.$$

The beneficial effects of the present invention is that: the zero-delay phase-locked loop frequency synthesizer provided by the present disclosure uses a multi-stage synchronization divider structure to synchronize the output clock signal of the voltage control oscillator step by step, and finally controls the relative delay of the divider to Tsyn3, that is, a gate delay. At the same time, the phase consistency between the reference clock signal and the output clock signal of the voltage control oscillator is realized to the greatest extent without adding an additional adjustable delay unit, thus obtaining a zero-delay clock signal. Compared with the traditional technology, the circuit of the present disclosure is simpler, and it is not necessary to add a plurality of adjustable delay units in the phase-locked loop circuit to realize the phase alignment of the output signal and the reference signal, thereby reducing the circuit complexity and the system power consumption, and therefore the circuit can be applied to wider fields such as communication, phased arrays and the like.

DESCRIPTION OF EMBODIMENTS

For an ideal divider, its input and output clock signals are naturally consistent in phase. However, in the actual circuit, any module will have a certain delay. In the present disclosure, the influence of this delay is minimized. In order to make the purpose and effect of the present disclosure clearer, the present disclosure will be further explained in detail with reference to the drawings. It should be appreciated that what is described herein is only for explaining the present disclosure, rather than to limit the present disclosure.

Figure 1:
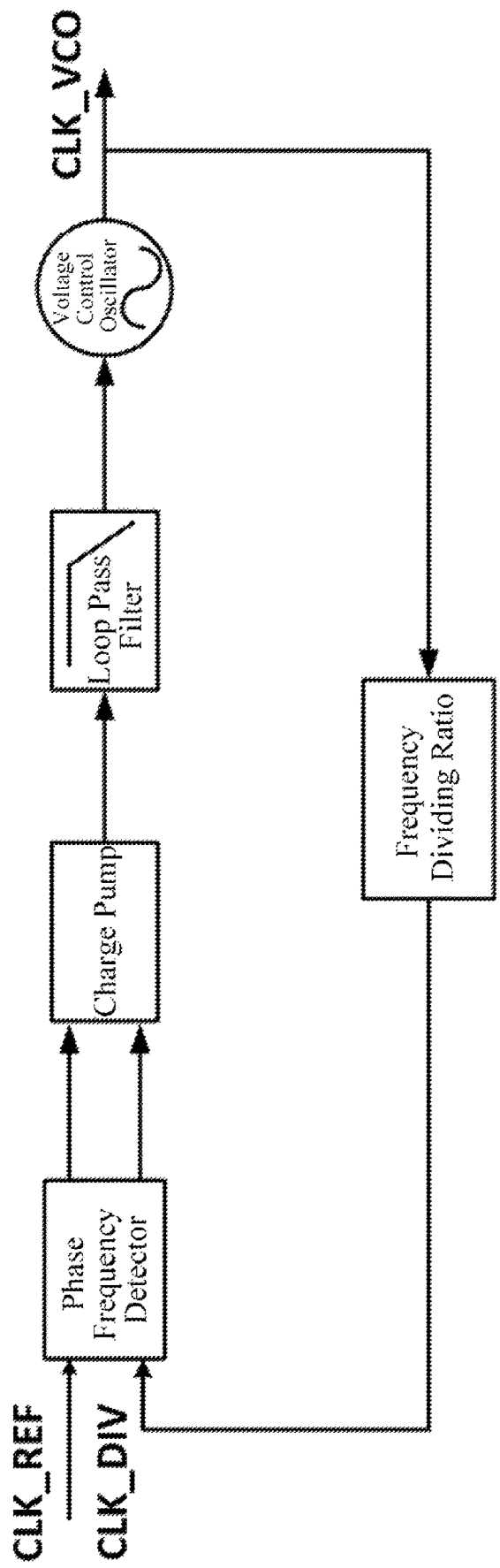
FIG. 1 is a schematic diagram of a traditional phase-locked loop circuit.
Figure 2:
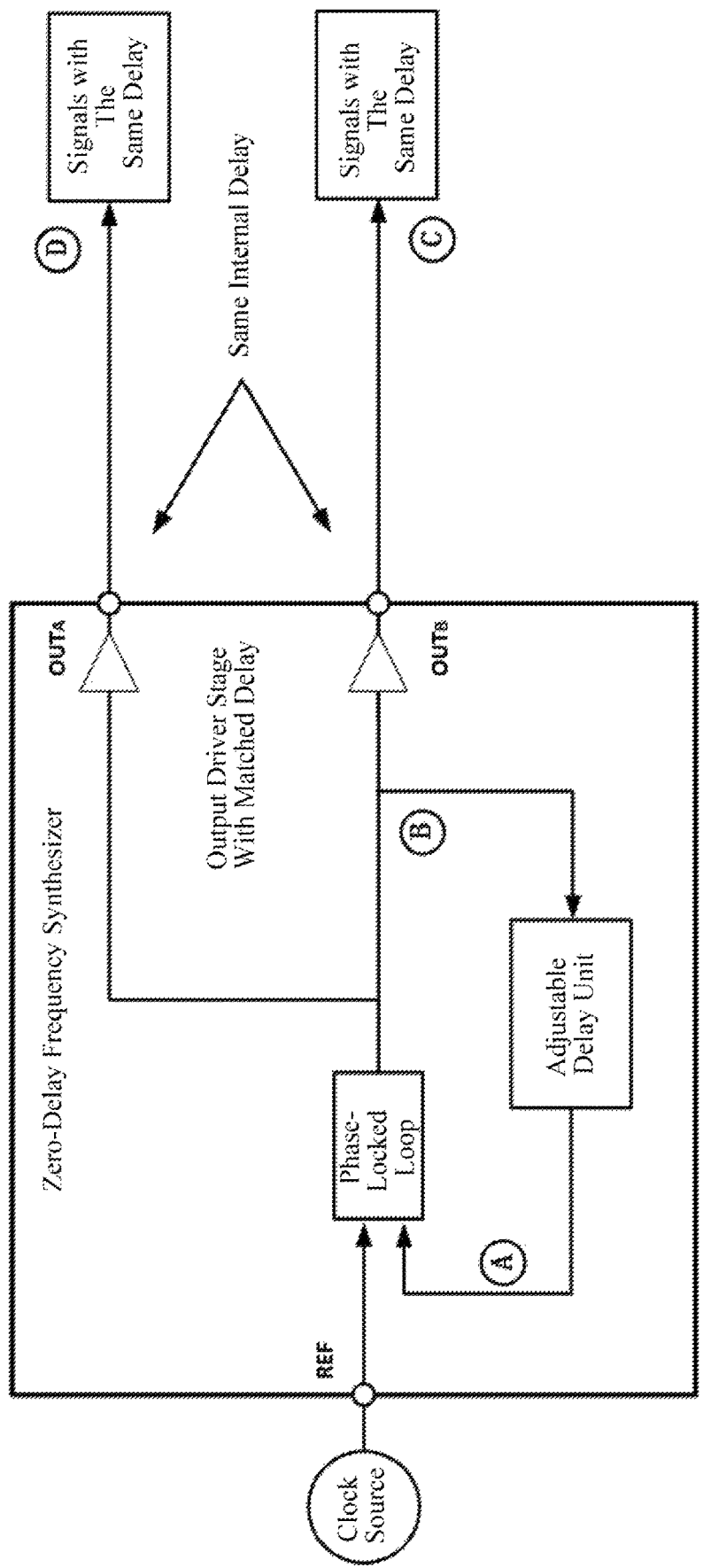
FIG. 2 is a schematic diagram of a traditional zero-delay phase-locked loop frequency synthesizer.
Figure 3:
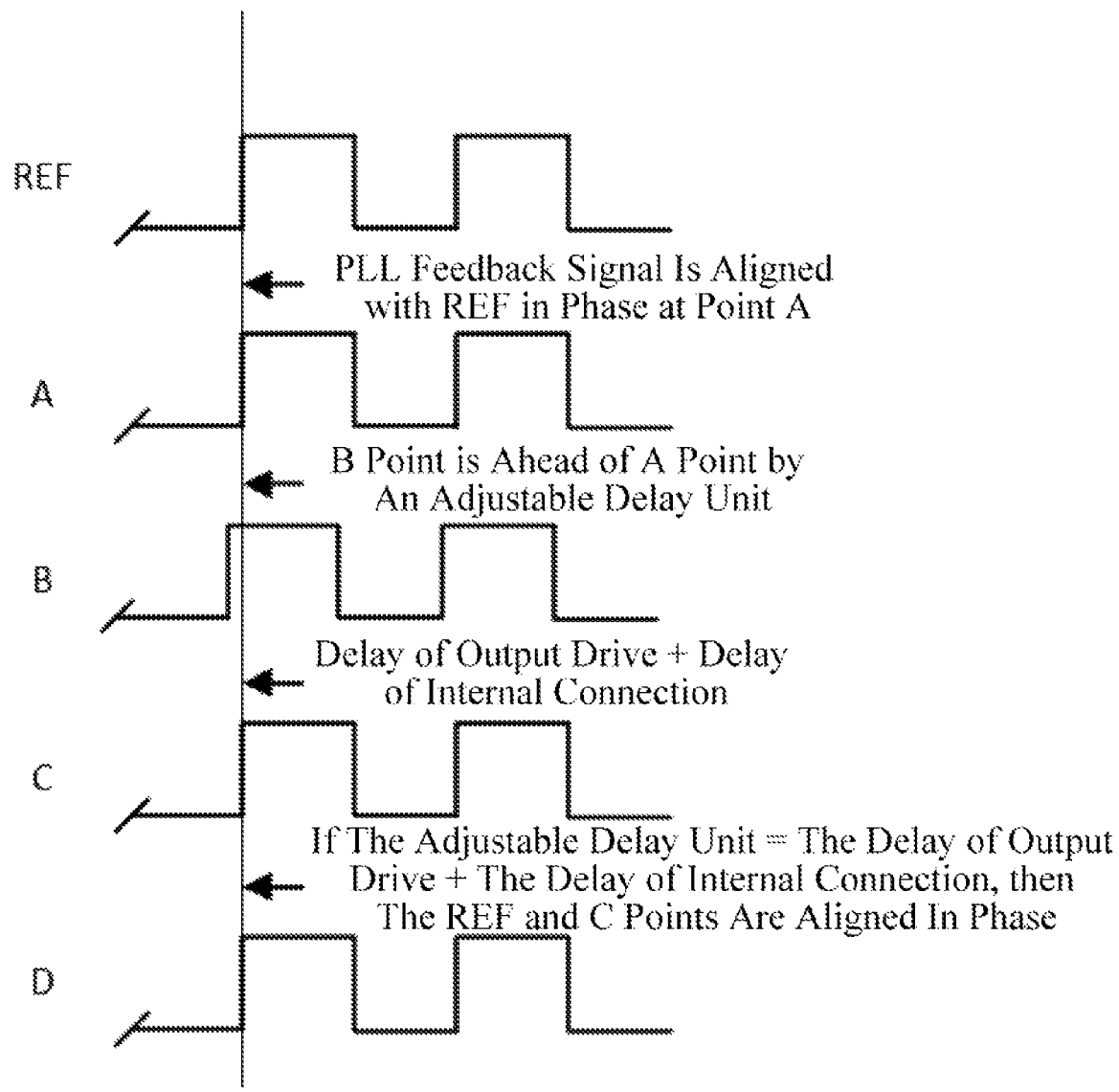
FIG. 3 is a schematic diagram of a signal of each point of the traditional zero-delay phase-locked loop frequency synthesizer.

FIGS. 1-3 show the traditional zero-delay phase-locked loop frequency synthesizer circuit, which realizes the phase consistency between the output clock signal and the input reference clock signal through the adjustable delay unit, so as to achieve the purpose of zero delay.

Figure 4:
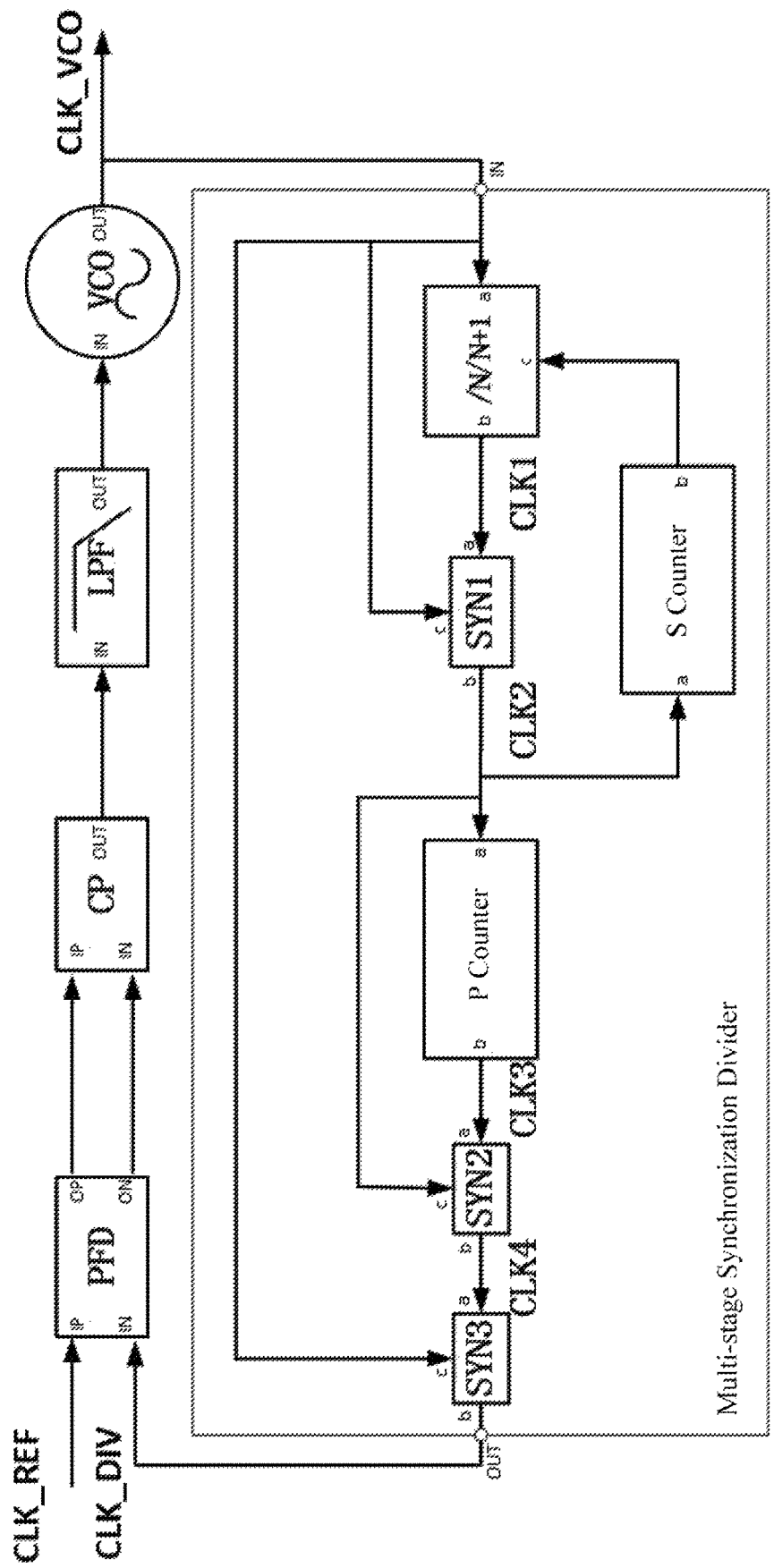
FIG. 4 is a schematic diagram of an improved zero-delay phase-locked loop frequency synthesizer.

FIG. 4 is a schematic diagram of an improved zero-delay phase-locked loop frequency synthesizer. Different from the traditional PLL system, the first clock synchronization module SYN1, the second clock synchronization module SYN2 and the third clock synchronization module SYN3 are added to the PLL frequency synthesizer. The PLL frequency synthesizer specifically includes a phase frequency detector, a charge pump, a loop pass filter, a voltage control oscillator and a multi-stage synchronization divider, wherein an output OP end of the phase frequency detector is connected with an input IP end of the charge pump, an output ON end of the phase frequency detector is connected with an input IN end of the charge pump, an output end of the charge pump is connected with an input end of the loop pass filter, an output end of the loop pass filter is connected with an input end of the voltage control oscillator, an output end of the voltage control oscillator is connected with an input end of the multi-stage synchronous divider, and an output end of the multi-stage synchronous divider is connected with an input IN end of the phase frequency detector to form a feedback path.

In the synthesizer, the multi-stage synchronization divider adopts a PS counter structure, and specifically comprises a dual-modulus divider, a P counter, an S counter, a first clock synchronization module SYN1, a second clock synchronization module SYN2 and a third clock synchronization module SYN3; the output end of the voltage control oscillator is simultaneously connected with an input end a of the dual-modulus divider, an synchronization end c of the first clock synchronization module SYN1 and an synchronization end c of the third clock synchronization module SYN3; an output end b of the dual-modulus divider is connected with an input end a of the first clock synchronization module SYN1, and an output end b of the first clock synchronization module SYN1 is simultaneously connected with an input end a of the S counter, an input end a of the P counter and an synchronization end c of the second clock synchronization module SYN2; an output end b of the S counter is connected to a mode switch end c of the dual-modulus divider, and an output end b of the P counter is connected to an input end a of the second clock synchronization module SYN2, an output end b of the second clock synchronization module SYN2 is connected to an input end a of the third clock synchronization module SYN3, and an output end b of the third clock synchronization module SYN3 is connected to an input IN end of the phase frequency detector; an output signal CLK_VCO of the voltage control oscillator is further connected to the synchronization end c of the synchronization module SYN1 and the synchronization end c of the synchronization module SYN3.

Firstly, the output clock signal CLK_VCO of the voltage control oscillator is input into a multi-stage synchronization divider, and is divided by a dual-modulus divider, in which a large number of nonlinear delays are accumulated. The CLK_VCO input to the dual-modulus divider is divided to obtain a clock signal CLK1, which is then input to the first clock synchronization module SYN1; the first clock synchronization module SYN1 takes the CLK_VCO as a trigger clock to obtain an output signal CLK2, so that the output signal CLK2 and CLK_VCO are edge-aligned. The CLK2 is then input into a P counter and an S counter; when the S counter counts to a set value, it outputs a MC signal to the dual-modulus divider to change its frequency dividing ratio; the P counter continues counting until the P counter counts to the set value and outputs a pulse signal CLK3; the pulse signal CLK3 is input to the second clock synchronization module SYN2 to obtain an output signal CLK4. The second clock synchronization module SYN2 uses CLK1 as a trigger clock, so that its output signal CLK4 is edge-aligned with the output signal CLK1 of the first clock synchronization module SYN1. The pulse signal CLK4 is input to the third clock synchronization module SYN3 to obtain CLK_DIV, and the third clock synchronization module SYN3 uses the CLK_VCO as the trigger clock again, so that its output signal CLK_DIV and CLK_VCO are edge-aligned, that is, they are consistent in phase. The CLK_DIV is input into a phase frequency detector (PFD), and compared with a reference clock CLK_REF. After the loop is locked, the two are consistent in phase, and the CLK_VCO with the same phase as CLK_DIV is naturally consistent with CLK_REF in phase, thus realizing a zero-delay phase-locked loop frequency synthesizer.

Figure 5:
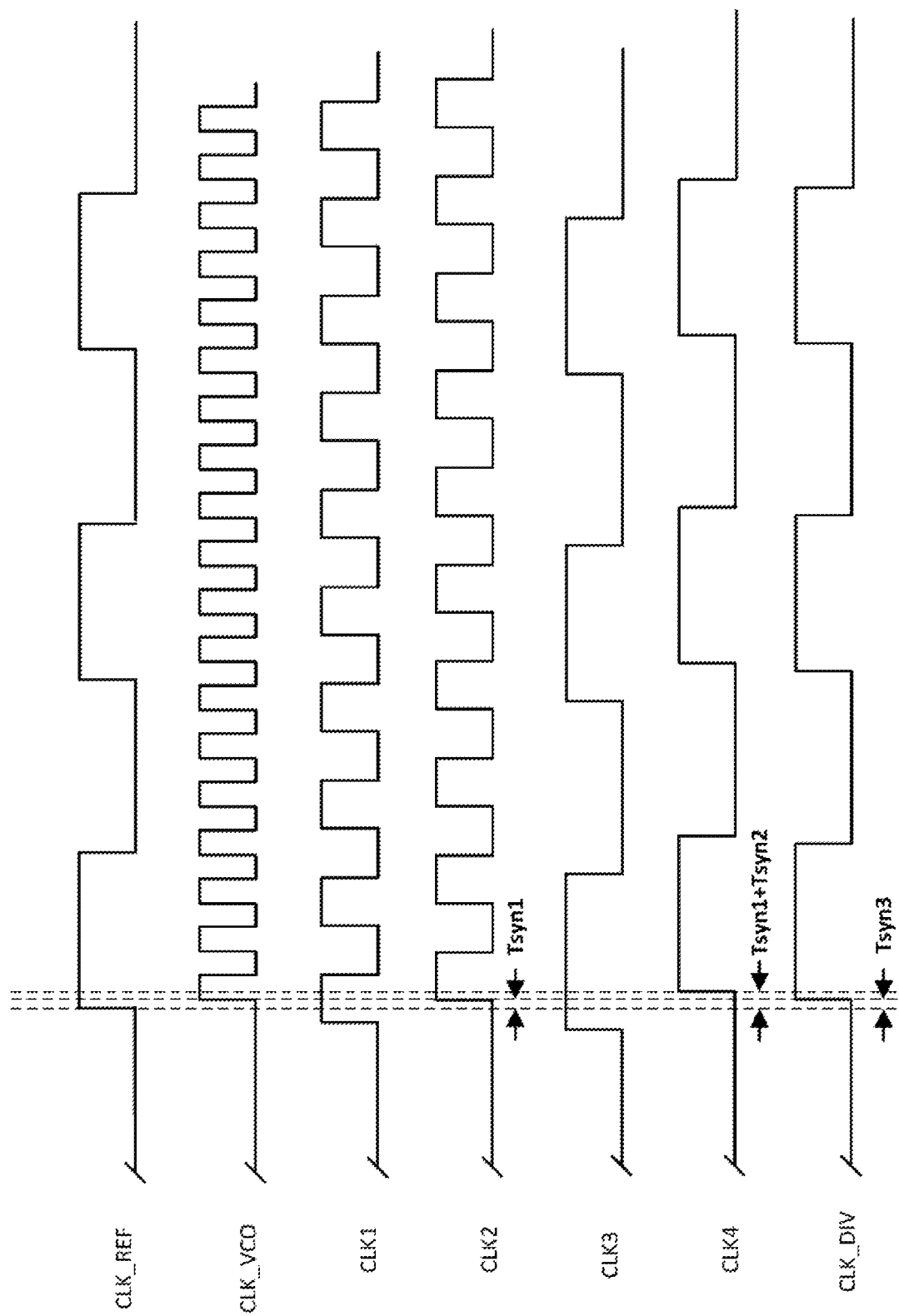
FIG. 5 is a schematic diagram of a signal of each point of the improved zero-delay phase-locked loop frequency synthesizer of the present disclosure.

FIG. 5 is a schematic signal diagram of the zero-delay phase-locked loop frequency synthesizer based on multi-stage synchronization according to the present disclosure.

CLK_VCO will accumulate a certain delay $T_{delay1}$ after passing through the dual-modulus divider, which makes CLK1 and CLK_VCO have a certain phase difference. In the first clock synchronization module SYN1, after the synchronization of CLK_VCO, CLK2 is aligned with CLK_VCO again. However, due to the non-ideality of the circuit, the first clock synchronization module SYN1 itself also has a time delay, namely $T_{syn1}$, but it is obvious that $T_{syn1} \ll T{delay1}$. When CLK2 is input to the P counter again, a large amount of delay $T_{delay2}$ will be accumulated there, so the delay between CLK3 and CLK_VCO is $T_{syn1}+T_{delay2}$. In the second clock synchronization module SYN2, the CLK4 is aligned with CLK2, so the delay between CLK4 and CLK_VCO is reduced to $T_{syn1}+T_{syn2}$. Similarly, since $T_{syn2} \ll T_{delay2}$, then $T_{syn1}+T_{syn2} \ll T_{syn1}+T_{delay2}$. CLK4 is synchronized with CLK_VCO in the third clock synchronization module SYN3, so that CLK4 and CLK_VCO are aligned, and there is only a delay of $T_{syn3}$ between the finally obtained CLK_DIV and CLK_VCO, while CLK_DIV and CLK_REF are aligned through the loop, finally making the phases of the CLK_VCO and CLK_REF aligned.

At the same time, it should be noted that the delay $T_{syn1}$ of the first clock synchronization module SYN1, the delay $T_{syn2}$ of the second clock synchronization module SYN2 and the delay $T_{CLK\_VCO}$ of the voltage control oscillator should satisfy: $Tsyn1+Tsyn2<T_{CLK\_VCO}$. That is, when the CLK_VCO samples CLK3, the delay between them should be less than $T_{CLK\_VCO}$. Otherwise, due to the non-ideal factors of the circuit, the sampling of CLK3 by the CLK_VCO may occur at its rising edge, which leads to sampling failure, and then leads to logic confusion of the divider.

Figure 6:
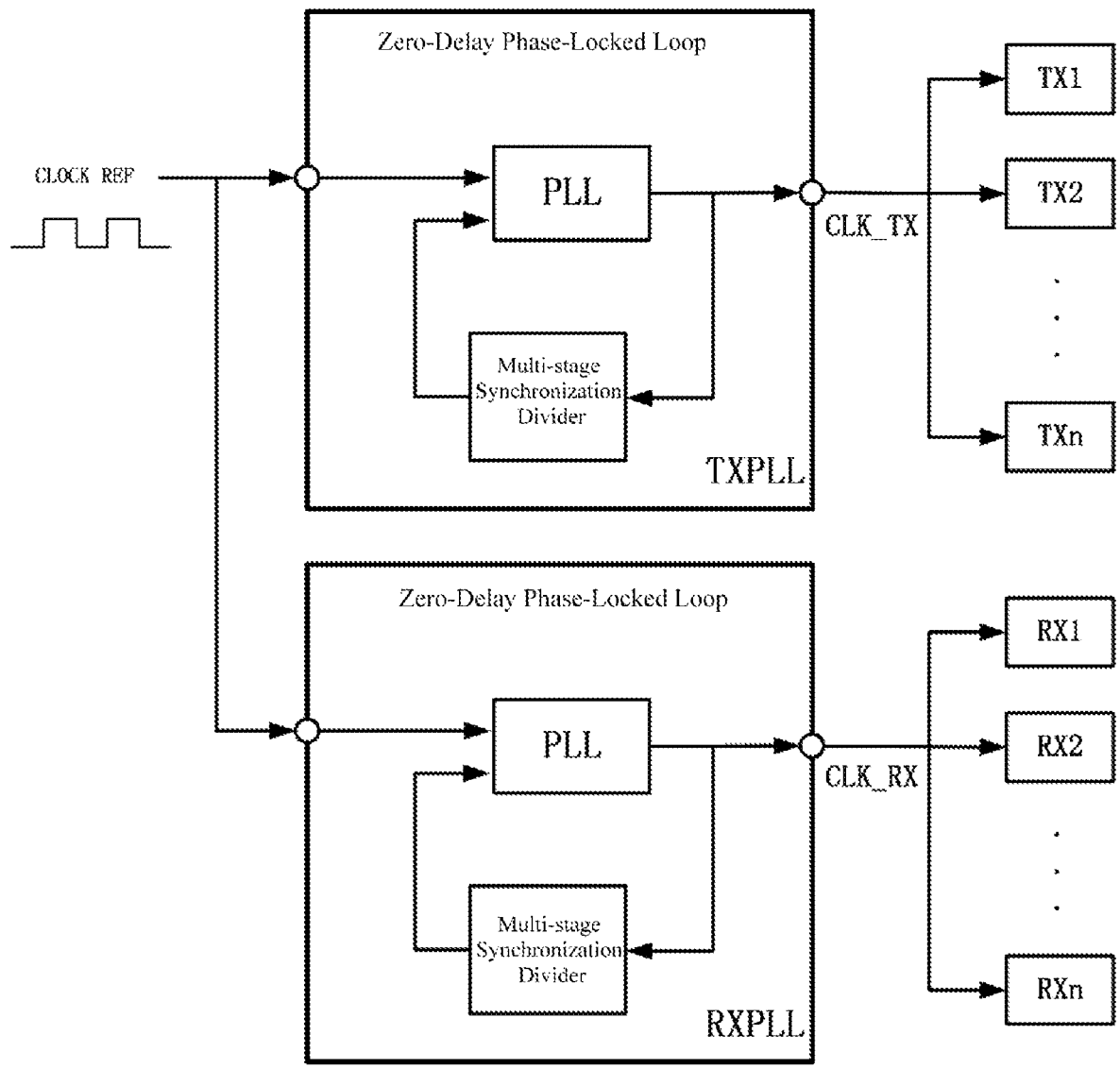
FIG. 6 shows the application of the present disclosure to a multi-channel transceiver system.

FIG. 6 is a diagram showing the application of the zero-delay phase-locked loop frequency synthesizer based on multi-level synchronization in a multi-channel transceiver system. The reference clock signal CLK_REF is provided from the same signal source to TXPLL and RXPLL. Due to the characteristics of the zero-delay phase-locked loop, its output clocks CLK_TX and CLK_RX are phase-aligned with the reference clock signal CLK_REF, while the consistency between the phases of the clock signals reaching each module is realized by adjusting signal paths from TXPLL and RXPLL to respective TX and RX modules, thereby finally realizing the synchronization of all TX and RX paths.

What is claimed is:

1. A zero-delay phase-locked loop frequency synthesizer based on multi-stage synchronization, comprising a phase frequency detector, a charge pump, a loop pass filter, a voltage control oscillator and a multi-stage synchronization divider, wherein an output OP end of the phase frequency detector is connected with an input IP end of the charge pump, an output ON end of the phase frequency detector is connected with an input IN end of the charge pump, an output end of the charge pump is connected with an input end of the loop pass filter, an output end of the loop pass filter is connected with an input end of the voltage control oscillator, an output end of the voltage control oscillator is connected with an input end of the multi-stage synchronous divider, and an output end of the multi-stage synchronous divider is connected with an input IN end of the phase frequency detector to form a feedback path;

wherein the multi-stage synchronization divider adopts a PS counter structure which specifically comprises a dual-modulus divider, a P counter, an S counter, a first clock synchronization module SYN1, a second clock synchronization module SYN2 and a third clock synchronization module SYN3; the output end of the voltage control oscillator is simultaneously connected with an input end a of the dual-modulus divider, an synchronization end c of the first clock synchronization module SYN1 and an synchronization end c of the third clock synchronization module SYN3; an output end b of the dual-modulus divider is connected with an input end a of the first clock synchronization module SYN1, and an output end b of the first clock synchronization module SYN1 is simultaneously connected with an input end a of the S counter, an input end a of the P counter and an synchronization end c of the second clock synchronization module SYN2; an output end b of the S counter is connected to a mode switch end c of the dual-modulus divider, and an output end b of the P counter is connected to an input end a of the second clock synchronization module SYN2, an output end b of the second clock synchronization module SYN2 is connected to an input end a of the third clock synchronization module SYN3, and an output end b of the third clock synchronization module SYN3 is connected to an input IN end of the phase frequency detector; an output signal CLK_VCO of the voltage control oscillator is further connected to the synchronization end c of the synchronization module SYN1 and the synchronization end c of the synchronization module SYN3;

wherein the multi-stage synchronization divider adopts a PS counter structure which specifically comprises a dual-modulus divider, a P counter, an S counter, a first clock synchronization module SYN1, a second clock synchronization module SYN2 and a third clock synchronization module SYN3; the output end of the voltage control oscillator is simultaneously connected with an input end a of the dual-modulus divider, an synchronization end c of the first clock synchronization module SYN1 and an synchronization end c of the third clock synchronization module SYN3; an output end b of the dual-modulus divider is connected with an input end a of the first clock synchronization module SYN1, and an output end b of the first clock synchronization module SYN1 is simultaneously connected with an input end a of the S counter, an input end a of the P counter and an synchronization end c of the second clock synchronization module SYN2; an output end b of the S counter is connected to a mode switch end c of the dual-modulus divider, and an output end b of the P counter is connected to an input end a of the second clock synchronization module SYN2, an output end b of the second clock synchronization module SYN2 is connected to an input end a of the third clock synchronization module SYN3, and an output end b of the third clock synchronization module SYN3 is connected to an input IN end of the phase frequency detector; an output signal CLK_VCO of the voltage control oscillator is further connected to the synchronization end c of the synchronization module SYN1 and the synchronization end c of the synchronization module SYN3.

2. The zero-delay phase-locked loop frequency synthesizer based on multi-stage synchronization according to claim 1, wherein the output clock signal CLK_VCO of the voltage control oscillator is input to the multi-stage synchronization divider, and a clock signal CLK1 obtained by frequency division by the dual-modulus divider is input to the first clock synchronization module SYN1; the first clock synchronization module SYN1 takes CLK_VCO as a trigger clock to obtain an output signal CLK2, which is input to the P counter and the S counter; the S counter outputs a MC signal, the P counter outputs a pulse signal CLK3; the pulse signal CLK3 is input to the second clock synchronization module SYN2 to obtain an output signal CLK4; the pulse signal CLK4 is input to the third clock synchronization module SYN3 to obtain CLK_DIV; the CLK_DIV is input into the phase frequency detector (PFD), and is compared with a reference clock CLK_REF in terms of phase.

3. The zero-delay phase-locked loop frequency synthesizer based on multi-stage synchronization according to claim 2, wherein a delay $T_{syn1}$ of the first clock synchronization module SYN1, a delay $T_{syn2}$ of the second clock synchronization module SYN2 and a delay $T_{CLK\_VCO}$ of the voltage control oscillator satisfy: $T_{syn1}+T_{syn2}<T_{CLK\_VCO}$.

* * * * *